US007345499B2

(12) United States Patent
Billingsley et al.

(10) Patent No.: US 7,345,499 B2
(45) Date of Patent: Mar. 18, 2008

(54) METHOD OF KELVIN CURRENT SENSE IN A SEMICONDUCTOR PACKAGE

(75) Inventors: John A. Billingsley, Austin, TX (US); Erin L. Taylor, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 11/331,783

(22) Filed: Jan. 13, 2006

(65) Prior Publication Data

US 2007/0164764 A1    Jul. 19, 2007

(51) Int. Cl.
*G01R 31/26* (2006.01)
*G01R 31/02* (2006.01)

(52) U.S. Cl. .................... 324/769; 324/763
(58) Field of Classification Search ............ 324/763, 324/765, 769
See application file for complete search history.

(56) References Cited

U.S. PATENT DOCUMENTS

| | | | | |
|---|---|---|---|---|
| 4,818,895 A * | 4/1989 | Kaufman | ............ | 327/565 |
| 4,945,445 A * | 7/1990 | Schmerda et al. | ............ | 361/101 |
| 5,029,322 A * | 7/1991 | Einzinger et al. | ............ | 257/341 |
| 5,034,796 A * | 7/1991 | Zommer | ............ | 257/341 |
| 5,153,696 A * | 10/1992 | Kayama | ............ | 257/350 |
| 5,153,969 A * | 10/1992 | Kayama | ............ | 257/350 |
| 5,170,312 A * | 12/1992 | Davies et al. | ............ | 361/100 |
| 5,745,350 A * | 4/1998 | Archer et al. | ............ | 363/15 |
| 5,962,912 A * | 10/1999 | Hierold | ............ | 257/537 |
| 6,130,813 A * | 10/2000 | Kates et al. | ............ | 361/93.1 |
| 6,552,889 B1 | 4/2003 | Huang et al. | | |
| 6,858,922 B2 * | 2/2005 | Pavier | ............ | 257/676 |
| 6,953,998 B2 * | 10/2005 | Joshi | ............ | 257/777 |
| 6,957,161 B2 * | 10/2005 | Allen et al. | ............ | 702/108 |
| 2006/0151861 A1 * | 7/2006 | Noquil et al. | ............ | 257/676 |
| 2006/0164867 A1 * | 7/2006 | Dikken et al. | ............ | 363/13 |

OTHER PUBLICATIONS

"Current-Sensing Power MOSFET's ", Vishay Siliconix, AN606, document No. 71991, published Dec. 17, 2003.
"Advanced Current Sensing Schemes and Power MOSET Selection", Summit Microelectronics, Inc., reference 3020 2.0, published Feb. 21, 2002.
"Ways of Monitoring Electrical Current", Sensors Online, Jul. 1999.
Product Specification entitled "BVR-Precision Current Sensing Resistors", Isotek Corporation, no date.

\* cited by examiner

*Primary Examiner*—Ha Tran Nguyen
*Assistant Examiner*—Roberto Velez
(74) *Attorney, Agent, or Firm*—Haynes and Boone, LLP

(57) ABSTRACT

Regulating a direct current-to-direct current (DC-DC) converter, a semiconductor switch having an improved current sensing technique is used to switch a DC voltage input at a predefined frequency. The switch includes a control pin to receive a control signal for controlling a current flowing between an input pin and an output pin. The switch also includes a Kelvin sense pin electrically coupled to an output pad located on a semiconductor die of the device for sensing the current. An electrical path from the output pad to the output pin in the form of a conductive lead wire has a predefined resistance. The current is Kelvin current sensed using the predefined resistance to tightly control deviation in the current beyond a predefined range.

4 Claims, 6 Drawing Sheets

METHOD OF KELVIN CURRENT SENSE IN A SEMICONDUCTOR PACKAGE

BACKGROUND

The present disclosure relates to the field of power supplies, and more particularly to methods and systems for improving regulation efficiency of a direct current-to-direct current (DC-DC) converter included in an information handling system.

As the value and use of information continues to increase, individuals and businesses seek additional ways to acquire, process and store information. One option available to users is information handling systems. An information handling system ('IHS') generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, entertainment, and/or global communications. In addition, information handling systems may include a variety of hardware and software components that may be configured to process, store, and communicate information and may include one or more computer systems, data storage systems, and networking systems.

Presently, many DC-DC converters provide over current protection (OCP) by sensing the voltage across the synchronous rectifier (low side switch) and comparing the voltage to a maximum value. Since the voltage is proportional to the current flowing through the switch, a need for a separate current sense resistor is often eliminated.

However, the proportionality factor that defines the relationship between the voltage and the current is dependent on the switch parameters such as on resistance. Typically, a value of the on resistance has a large degree of variance with respect to a nominal or rated value since it is dependent on semiconductor material properties, which may vary with each production run. That is, the value of on resistance may vary significantly, e.g., 100% variation, compared to the rated value, thereby causing a large variation in the current. For example, if an OCP set point is defined to be 110% of the rated current value, the actual value of current at which the OCP is triggered may vary from 110% of rated current and 220% of the rated current. Adoption of best design practices may result in the selection of an inductor capable of carrying 220% of the rated current, often resulting in increased cost and space. Failure to select a properly rated inductor may cause an undetected over current condition, thereby increasing inductor saturation, resulting in over voltage and causing possible damage to a load connected to the DC-DC converter.

Therefore, a need exists for regulating a DC-DC converter of a power supply. More specifically, a need exists to provide a DC-DC converter having an improved current sensing technique that provides a narrower range of variance in OCP set points. Accordingly, it would be desirable to provide for a more efficient and reliable power supply included in an IHS, absent the disadvantages found in the prior methods discussed above.

SUMMARY

The foregoing need is addressed by the teachings of the present disclosure, which relates to providing over current protection in a power supply. Accordingly, one embodiment provides for sensing current flowing through a semiconductor device including selecting a portion of a current path within the semiconductor device. The selected portion of the current path is in the form of a conductive lead wire from a Kelvin sense pin of the device to the output pin of the device. The conductive lead wire has a predefined resistance that is independent of semiconductor properties of the semiconductor device. The current is sensed by measuring voltage across the conductive lead wire.

DETAILED DESCRIPTION

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices, boards, cards, modules, blocks, and/or components described herein may be implemented as hardware (including discrete components, integrated circuits and systems-on-a-chip 'SOC'), firmware (including application specific integrated circuits and programmable chips) and/or software or a combination thereof, depending on the application requirements.

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, the IHS may be a personal computer, including notebook computers, personal digital assistants, cellular phones, gaming consoles, a network storage device, or any other suitable device and may vary in size, shape, performance, functionality, and price. The information handling system may include random access memory (RAM), one or more processing resources such as central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to receive/transmit communications between the various hardware components.

Figure 1:
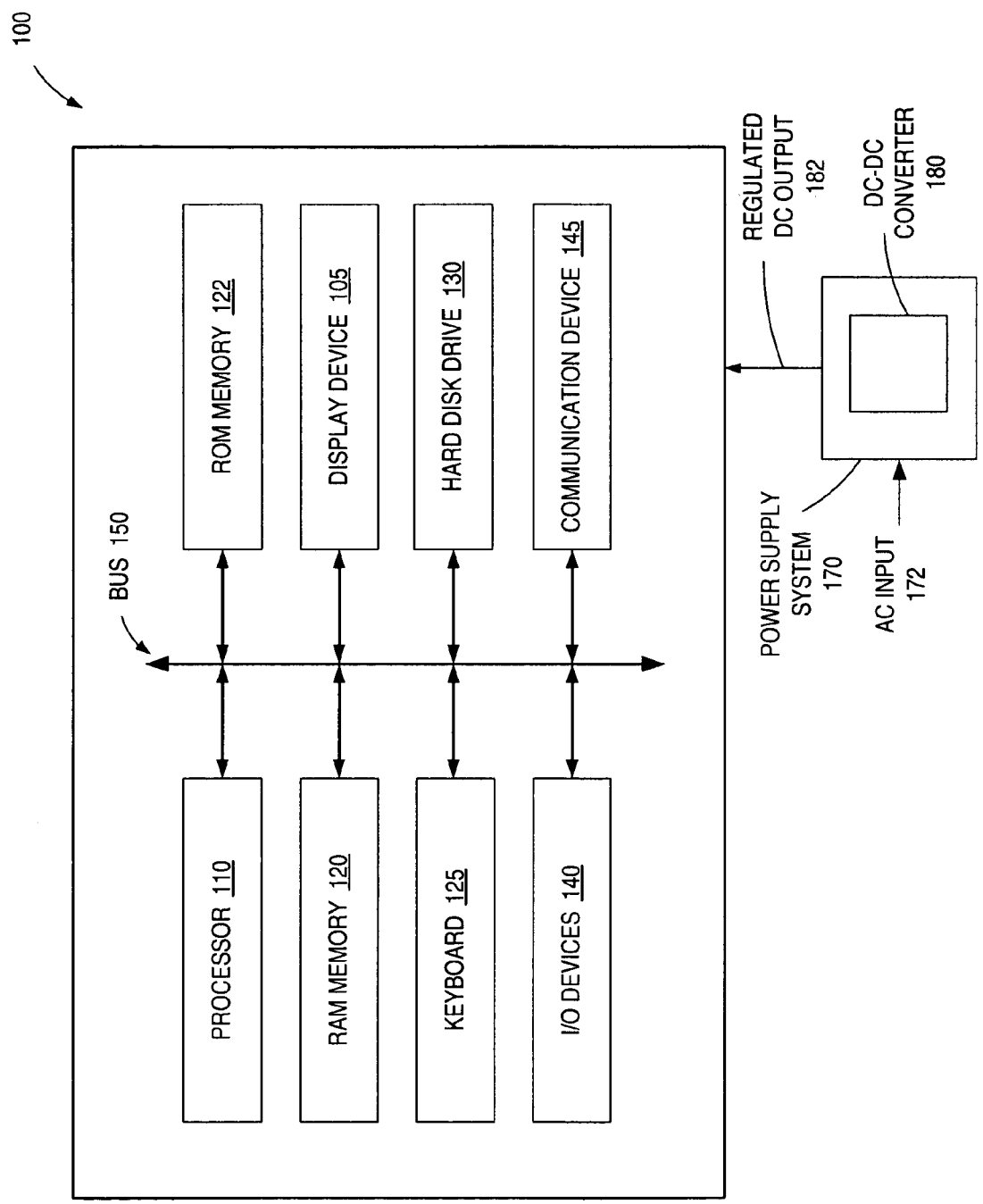
FIG. 1 illustrates a block diagram of an information handling system having an improved power supply, according to an embodiment.

FIG. 1 illustrates a block diagram of an information handling system 100 having an improved power supply, according to an embodiment. The information handling system 100 includes a processor 110, a system random access memory (RAM) 120 (also referred to as main memory), a non-volatile read only memory (ROM) 122 memory, a display device 105, a keyboard 125 and an I/O controller 140 for controlling various other input/output devices. For example, the I/O controller 140 may include a keyboard controller, a cursor device controller and/or the serial I/O controller. It should be understood that the term "information handling system" is intended to encompass any device having a processor that executes instructions from a memory medium.

The IHS 100 is shown to include a hard disk drive 130 connected to the processor 110, although some embodiments may not include the hard disk drive 130. In a particular embodiment, the IHS 100 may include additional hard disks. The processor 110 communicates with the system components via a bus 150, which includes data, address and control lines. In one embodiment, the IHS 100 may include multiple instances of the bus 150. A communications device 145, such as a network interface card and/or a radio device, may be connected to the bus 150 to enable wired and/or wireless information exchange between the IHS 100 and other devices (not shown).

In a particular embodiment, the IHS 100 receives power from a power supply system 170 having a direct current-to-direct current (DC-DC) converter 180. The power supply system 170 receives an alternating current (AC) input 172 such as 110/120 volts from an electrical wall outlet. The DC-DC converter 180 provides a regulated DC output 182 to a load. The load may include one or more components of the IHS 100 such as the processor 110. Additional detail of the DC-DC converter 180 having an improved current sensing technique is described with reference to FIG. 2.

The processor 110 is operable to execute the computing instructions and/or operations of the IHS 100. The memory medium, e.g., RAM 120, preferably stores instructions (also known as a "software program") for implementing various embodiments of a method in accordance with the present disclosure. An operating system (OS) of the IHS 100 is a type of software program that controls execution of other software programs, referred to as application software programs. In various embodiments the instructions and/or software programs may be implemented in various ways, including procedure-based techniques, component-based techniques, and/or object-oriented techniques, among others. Specific examples include assembler, C, XML, C++objects, Java and Microsoft's .NET technology.

Figure 2:
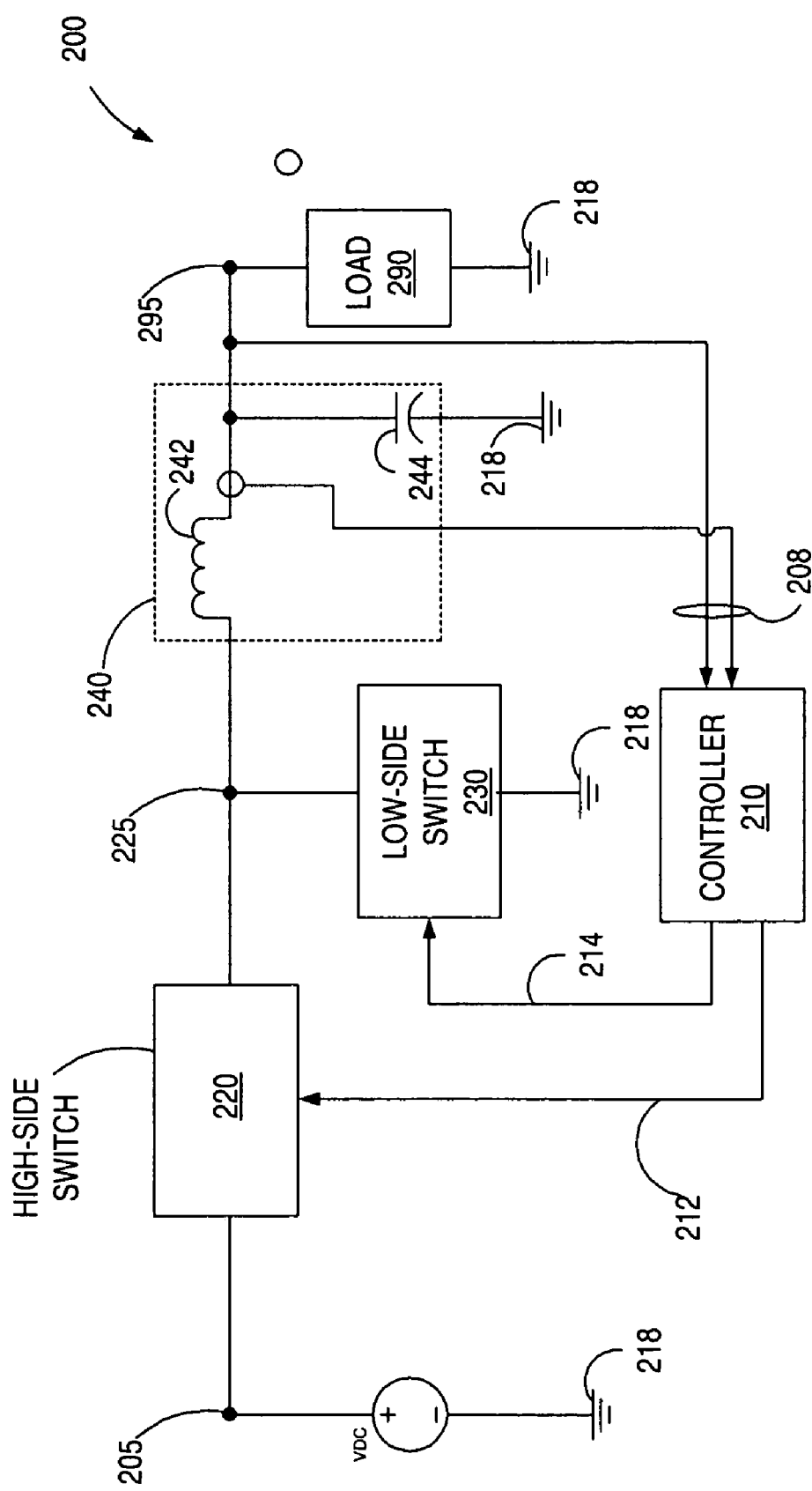
FIG. 2 is a block diagram illustrating additional details of a direct current-to-direct current (DC-DC) converter described with reference to FIG. 1, according to an embodiment.

FIG. 2 is a block diagram illustrating additional details of a direct current-to-direct current (DC-DC) converter described with reference to FIG. 1, according to an embodiment. The DC-DC converter 200 is operable to receive a direct current (DC) voltage input 205 and generate a regulated DC voltage output 295. In one embodiment, the regulated DC voltage output 295 provides power to a load 290 such as the processor 110. The output 295 may also be used to power other components (not shown) included in the IHS 100. In a particular embodiment, the DC-DC converter 200 is substantially the same as the DC-DC converter 180 and the regulated DC voltage output 295 is substantially the same as the regulated DC output 182 described with reference to FIG. 1.

In the depicted embodiment, the DC-DC converter 200 includes:

a) a controller module 210 operable to receive a plurality of feedback inputs 208 such as the regulated DC voltage output 295 and currents to control a duty cycle;

b) a high-side switch 220 operable to receive the DC voltage input 205 and generate a switched DC voltage output 225 in response to receiving a control signal 212 from the controller module 210;

c) a low-side switch 230 electrically coupled in-between the switched DC voltage output 225 and a predefined voltage reference such as a ground 218. The operation of the low-side switch 230 is complementary to that of the high-side switch 220 and is controlled by a control signal 214 generated by the controller module 210. That is, the high-side switch 220 is closed when and low-side switch 230 is open and vice versa; and d) a filter module 240 electrically coupled in parallel to the low-side switch 230 to filter out alternating current (AC) components from the switched DC voltage output 225 and generate the regulated DC voltage output 295.

The DC voltage input 205 is generated by an AC/DC adapter (not shown) included in the power supply system 170, which provides power to the load 290. The load 290 may be one or more components of the IHS 100. During a charge cycle the high-side switch 220 is closed and the low-side switch 230 is open. During a discharge cycle the high-side switch 220 is open and the low-side switch 230 is closed. The opening and closing of the high-side and low-side switches 220 and 230 is controlled by the control signals 212 and 214 respectively. The DC voltage input 205 is "chopped" by the high-side switch 220 to generate the switched DC voltage output 225. The switched DC voltage output 225 may be a square wave having a predefined switching frequency. The square wave, which has several AC components, has an average voltage equal to the required output voltage. It is understood that each one of the high-side switch 220 and the low-side switch 230 may be implemented as a semiconductor switch. Examples of a semiconductor switch may include the bipolar junction transistor (BJT), the insulated gate bipolar transistor (IGBT), the metal-oxide semiconductor field effect transistor (MOSFET), thyristors such as a gate turn-off thyristor (GTO), a mosfet controlled thyristor (MCT), a silicon controlled rectifier (SCR), a junction field effect transistor (JFET) and similar others.

In one embodiment, the filter module 240 includes an inductance L 242 and a capacitor C 244. The filter module 240 filters the predefined switching frequency from the switched DC voltage output 225 and generates the regulated DC voltage output 295. The inductance L 242 and capacitor C 244 values may be selected based on factors such as the predefined switching frequency, maximum allowable current flowing through the load 290 and similar others.

Duty cycle is generally indicative of time during which a device and/or system is operated. Thus, the duty cycle of the DC-DC converter 200 may be expressed as a ratio or percentage of an ON period to the total (ON+OFF) period.

The control signals 212 and 214 control a duration of an ON and an OFF state of each one of the switches 220 and 230, thereby controlling the duty cycle of the DC-DC converter 200. Although the DC-DC converter 200 is shown to include a single phase it may optionally include additional phases to further reduce the voltage ripple.

In a particular embodiment, the controller module 210 monitors voltage across a selective portion of a current path within the low-side switch 230. By having known values for the voltage and for a predefined resistance value for the selective portion of the current path, a current value is derived using Ohms law. Thus, the controller module 210 is operable to monitor and control occurrence of an over current condition. That is, if the controller module 210 detects voltage across the selective portion to be greater than a predefined threshold then the control signal 212 is maintained in the de-asserted state to disable the flow of current. In a particular embodiment, the low-side switch 230 is a semiconductor device such as a MOSFET switch having the predefined resistance value for the selective portion of the current path. Additional details of the current sensing technique using the selective portion of the current path within the low-side switch 230 are described with reference to FIG. 3.

Figure 3:
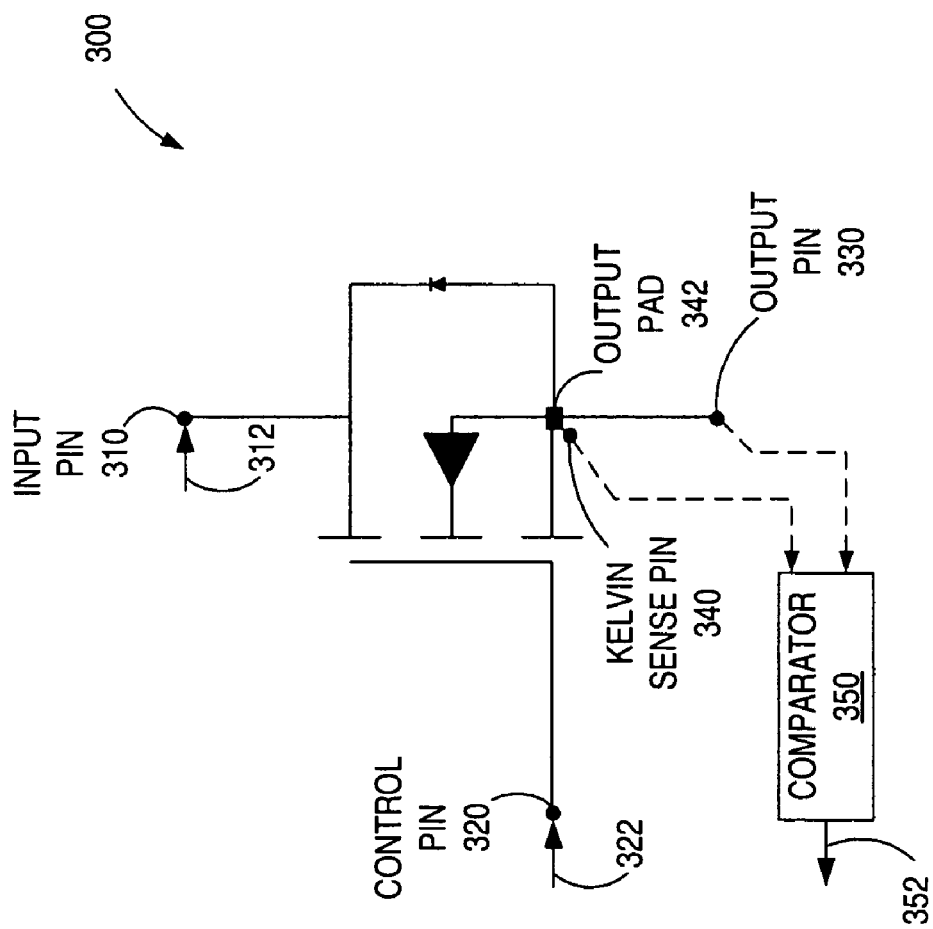
FIG. 3 is a schematic diagram illustrating additional details of a semiconductor switch described with reference to FIG. 2, according to an embodiment.

FIG. 3 is a schematic diagram illustrating additional details of a semiconductor switch described with reference to FIG. 2, according to an embodiment. In the depicted embodiment, the low-side switch 230 described with reference to FIG. 2 is implemented as a semiconductor device 300 having an input pin 310, a control pin 320, an output pin 330 and a Kelvin sense pin 340. In a particular embodiment, the input pin 310 is a drain pin, the control pin 320 is a gate pin and the output pin 330 is a source pin of a semiconductor switch. In another embodiment, the input pin 310 may be a source pin, the control pin 320 may be a gate pin and the output pin 330 may be a drain pin of another semiconductor switch. Thus, it is understood that the input/output functions may reverse depending on choice of p-channel or n-channel semiconductor switches. In the depicted embodiment, the input pin 310 receives an input 312 such as the switched DC voltage output 225. The output pin 330 is coupled to a predefined voltage output such as the ground 218. The control pin 320 receives a control signal 322 such as the control signal 214. The conductive, e.g., ON state and the non-conductive, e.g., OFF state, of the semiconductor device 300 is controlled by asserting or de-asserting the control signal 322. Thus, the control signal 322 controls a flow of current between the output pin 330 and the input pin 310. Additional details of package layout arrangements for the pins 310, 320, 330 and 340 are described with reference to FIG. 4A and 4B.

The ON state resistance (or the internal resistance) of the semiconductor device 300 is dependent on properties of the semiconductor material used to manufacture the device. The on resistance is computed by equation 100 as follows:

$$R(\text{on resistance}) = R_{source} + R_{ch} + R_A + R_J + R_D + R_{sub} + R_{cum} \quad \text{Equation 100}$$

where $R_{source}$ is source diffusion resistance, $R_{ch}$ is channel resistance, $R_A$ is accumulation resistance, $R_J$ is JFET component resistance of the region between the two body regions, $R_D$ is the drift region resistance, $R_{sub}$ is the substrate resistance and $R_{cum}$ is the cumulative conductive path resistance between the output pin 330 and the input pin 310. The cumulative conductive path resistance may include bond wire resistance, the contact resistance between the source and drain metallization and the silicon, metallization and leadframe contributions. Thus, due to the dependence of on resistance on semiconductor properties, a value of the on resistance may vary significantly compared to a rated or nominal value.

In the ON state, the current path within the semiconductor device 300 includes the input pin 310, a semiconductor channel (not shown), the Kelvin sense pin 340 and the output pin 330. In the depicted embodiment, resistance of the conductive path between an output pad 342 located on a semiconductor die of the device 300 and the output pin 330 is known, e.g., may be derived based on length, diameter and type of conductive material. Since the resistance of the conductive path is known and is relatively independent of the semiconductor properties of the semiconductor device 300, there is less variation in a value of the resistance of the conductive path compared to the variation in the value of on resistance. In a particular embodiment, a lesser variation in the resistance of the conductive path provides a more accurate determination of the current value compared to the accuracy provided by on resistance based current sense technique.

In high current, low resistance applications, a Kelvin current sensing technique typically uses separate wiring paths for the current-carrying circuits and the measurement circuits. The Kelvin sensing or measurement technique uses four-wire measurements. Many low-value precision resistors have four terminals—two for carrying current and two for measuring the voltage across the resistance element. However, four-wire resistors may be unavailable in low cost integrated circuit (IC) package form. If low cost four wire resistors may not be available, two-wire components may be used along with using a Kelvin-connection pc-board-layout technique. The Kelvin connection pc-board layout technique (also referred to as a force and sense technique) substantially prevents circuit board trace resistance from adding to the value of the resistor.

As described earlier, current flowing through the semiconductor device 300 is sensed and/or measured by performing a Kelvin current sense across the conductive path between the output pad 342 located on a semiconductor die of the device 300 and the output pin 330 having the predefined resistance. The Kelvin sense pin 340 is coupled to the output pad 342. For DC signals, the output pad 342 and the Kelvin sense pin 340 may be equivalent. However, they may not be considered to be equivalent across a frequency range of interest due to the impedance of the Kelvin Sense interconnect. Majority of the current flows through the output pin 330 and the output pad 342, while lesser current flows through the Kelvin sense pin 340. In a particular embodiment, a comparator 350 is used to compute a voltage difference 352 between the output pad 342 and the output pin 330. In a particular embodiment, the comparator 350 is a differential amplifier. Since the resistance of the conductive path between the output pad 342 and the output pin 330 is known, a value of the current is computed based on the measured voltage difference 352. In a particular embodiment, the voltage difference 352 is provided to the controller 210 as one of the plurality of feedback inputs 208. If the voltage difference 352 exceeds a predefined threshold, e.g., 150% of rated value, the controller 210 de-asserts the control signal 212 to turn OFF the high-side switch 220, thereby interrupting the flow of current through the device to provide OCP. In an embodiment, the control signal 214 may be asserted to latch on the low-side switch 230.

In an exemplary, non-depicted embodiment, the Kelvin sense pin 340 may be coupled to an input pad (not shown) located on the semiconductor die of a device and the input pin 310. In this embodiment, the current flowing through the semiconductor device 300 is sensed and/or measured by performing a Kelvin current sense across the conductive path between the input pad and the input pin 310 having the predefined resistance.

Figure 4A:
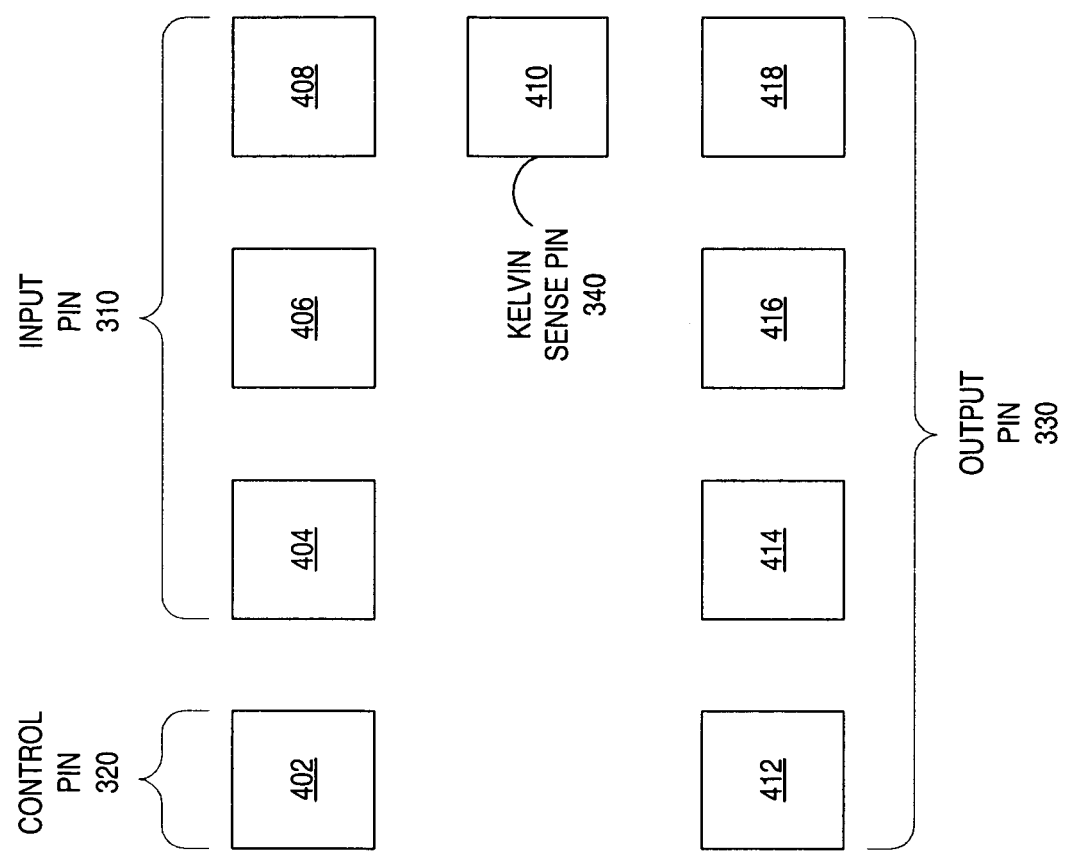
FIG. 4A illustrates a pin/pad layout arrangement for a semiconductor device packaged as a small outline integrated circuit, according to an embodiment.

FIG. 4A illustrates a pin/pad layout arrangement for a semiconductor device packaged as a small outline integrated circuit, according to an embodiment. In the depicted embodiment, the semiconductor device 300 described with reference to FIG. 3 is implemented as a small outline (SO) integrated circuit (IC) having 9 pins/pads. In a particular embodiment, a standard 8 pin switch SO8 IC may be modified by adding a 9$^{th}$ pin/pad for the Kelvin sensing. In the depicted embodiment, the output pin 330 is configured by electrically coupling a plurality of pins/pads 412, 414, 416 and 418. The control pin 320 is substantially the same as pin/pad 402. The input pin 310 is configured by electrically coupling a plurality of pins/pads 404, 406, and 408. The Kelvin sense pin 340 is substantially the same as a 9$^{th}$ pin/pad 410. Current flowing through the semiconductor device 300 is sensed by performing a Kelvin current sense measurement across the conductive path between the pin/pad 410 and the pins/pads 404, 406, 408.

Figure 4B:
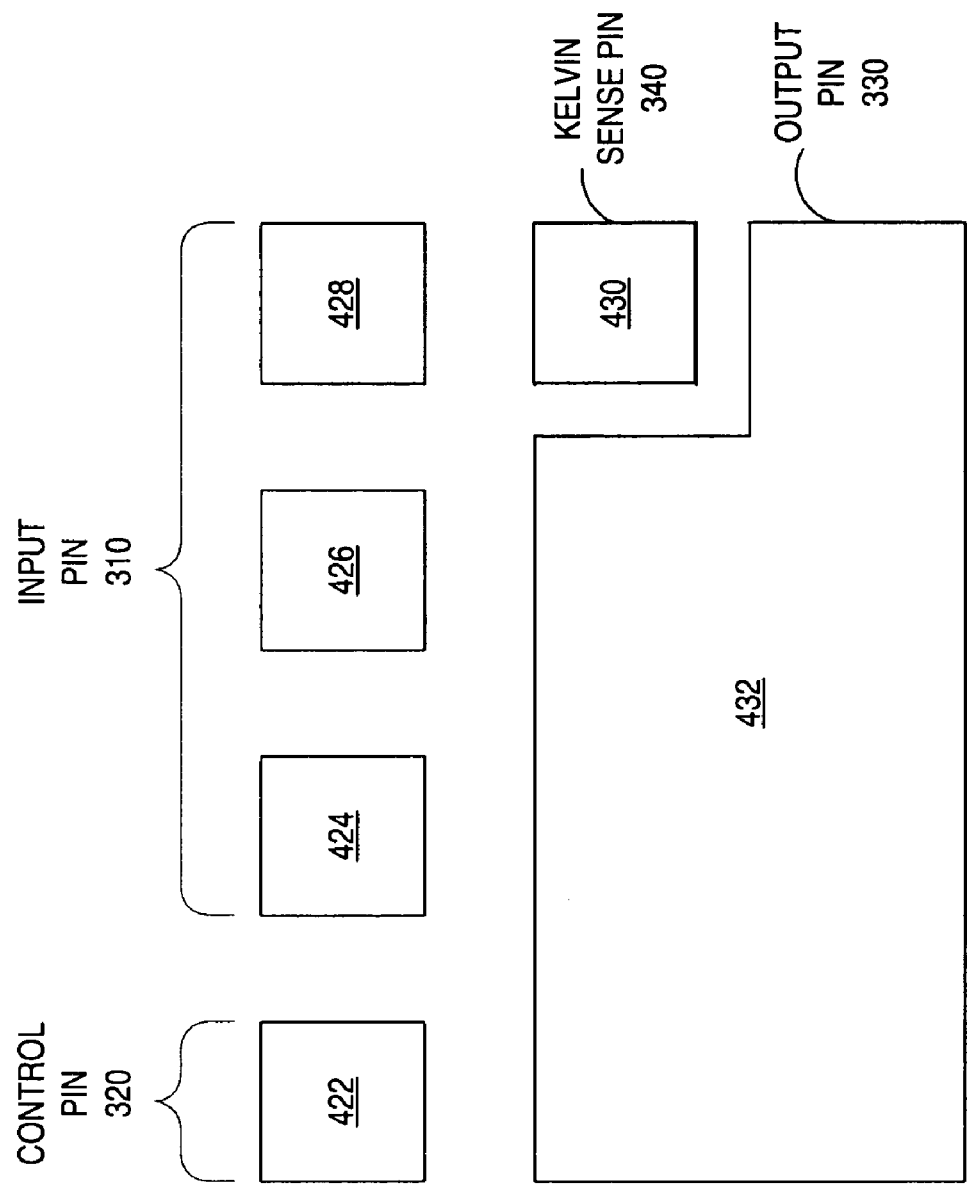
FIG. 4B illustrates a pin/pad layout arrangement for a semiconductor device packaged as a flip-leaded molded package (FLMP), according to an embodiment.

FIG. 4B illustrates a pin/pad layout arrangement for a semiconductor device packaged as a flip-leaded molded package (FLMP), according to an embodiment. In the depicted embodiment, the semiconductor device 300 described with reference to FIG. 3 is implemented as flip-leaded molded package (FLMP) integrated circuit (IC) having 6 pins/pads. In a particular embodiment, a standard 5 pin/pad switch FLMP IC may be modified by adding a 6$^{th}$ pin/pad for the Kelvin sensing. In the depicted embodiment, the output pin 330 is substantially the same as pin 432. The control pin 320 is substantially the same as pin/pad 422. The input pin 310 is configured by electrically coupling a plurality of pins/pads 424, 426 and 428. The Kelvin sense pin 340 is substantially the same as a 6$^{th}$ pin 430. In a particular embodiment, the standard 5 pin FLMP is modified by selecting a portion of the output pin as the Kelvin sense pin 430. Current flowing through the semiconductor device 300 is sensed by performing a Kelvin current sense measurement across the conductive path between the pin 430 and the pins 424, 426, 428.

Although FIGS. 4A and 4B describe two types of packaging for the semiconductor device 300, it is contemplated that the semiconductor device 300 may be packaged in a variety of alternative packaging forms such as dual-in-line (ceramic), dual-in-line (plastic), thin small outline package (TSOP), discrete packaging (DPAK, D2PAK and IPAK) and similar others.

Figure 5:
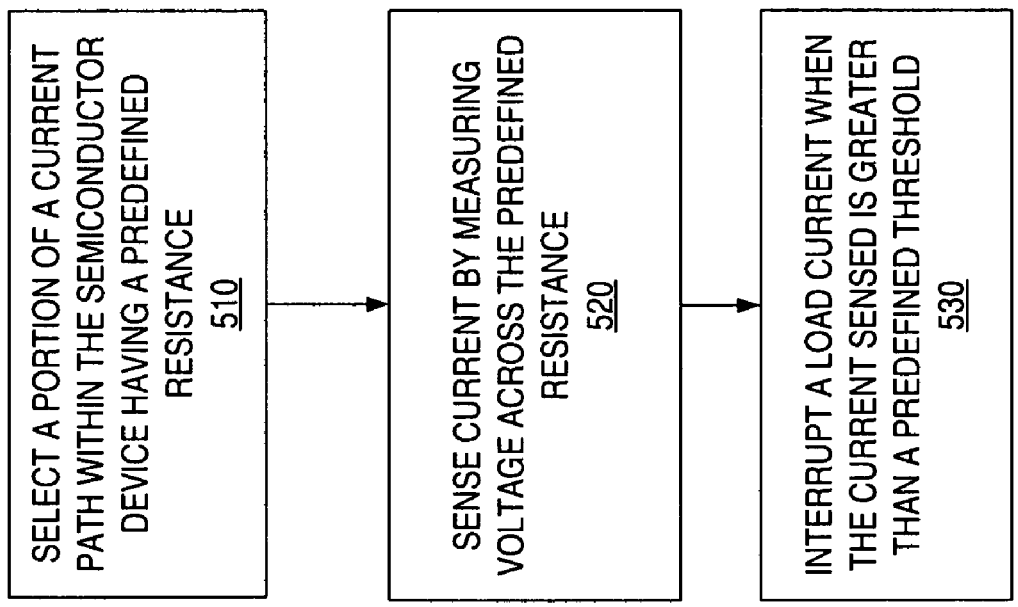
FIG. 5 is a flow chart illustrating a method for sensing current flowing through a semiconductor device, according to an embodiment.

FIG. 5 is a flow chart illustrating a method for sensing current flowing through a semiconductor device, according to an embodiment. In a particular embodiment, the semiconductor device is the semiconductor device 300 described with reference to FIG. 3. In step 510, a portion of a current path is selected within the semiconductor device. In an embodiment, the portion of the current path selected is in the form of a conductive lead or bond wire that has a predefined resistance. An example of a conductive lead wire may include the conductive path between the Kelvin sense pin 340 and the input pin 310 described with reference to FIG. 3. The conductive lead wire has a predefined resistance that has less variation and is independent of semiconductor properties of the semiconductor device compared to the on resistance. In step 520, current is sensed by measuring voltage across the conductive lead wire using Kelvin current sense techniques.

Various steps described above may be added, omitted, combined, altered, or performed in different orders. In a particular embodiment, an additional step 430 may be added to open the high-side switch 220 and turn on the low-side switch 230 in response to detecting an over current condition. In step 530, a load current path is interrupted when the current sensed is greater than a predefined threshold.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending bn the implementation. Accordingly, it is appropriate that the appended claims be construed broadly and in a manner consistent with the scope of the embodiments disclosed herein.

What is claimed is:

1. A semiconductor device comprising:
    an input pin to receive an input;
    an output pin coupled to a first side of a comparator;
    a control pin to receive a control signal, wherein the control signal controls a flow of current between the output pin and the input pin; and
    a Kelvin sense pin electrically coupled to an output pad located on the semiconductor device and also coupled to a second side of the comparator for determining voltage drop across the output pin, wherein a layout of the input pin, the output pin and the control pin is in accordance with an 8-pin small outline (SO8) integrated circuit (IC) footprint, and wherein the SO8 footprint is modified by including the Kelvin sense pin as a 9$^{th}$ pin.

2. The device of claim 1, wherein the semiconductor device is one of a bipolar junction transistor (BJT), an insulated gate bipolar transistor (IGBT), a metal-oxide semiconductor field effect transistor (MOSFET), a gate turn-off thyristor (GTO), a mosfet controlled thyristor (MCT), a silicon controlled rectifier (5CR), and a junction field effect transistor (JFET).

3. The device of claim 1, wherein functions of the input pin and the output pin are reversed.

4. An information handling system (IHS) comprising:
    a processor;
    a power supply having a semiconductor device, the power supply operable to provide power to the processor, wherein the semiconductor device includes:
    an input pin to receive an input;
    an output pin coupled to a first side of a comparator;
    a control pin to receive a control signal, wherein the control signal controls a flow of current between the output pin and the input pin and wherein the power is interrupted when a value of the current is greater than a predefined value; and
    a Kelvin sense pin electrically coupled to an output pad located on the semiconductor device and also coupled to a second side of the comparator for determining voltage drop across the output pin, wherein a layout of the input pin, the output pin and the control pin is in accordance with an 8-pin small outline (SO8 ) integrated circuit (IC) footprint, and wherein the SO8 footprint is modified by including the Kelvin sense pin as a 9$^{th}$ pin.

* * * * *